United States Patent [19]

Langer et al.

[11] 4,194,141

[45] Mar. 18, 1980

[54] ELECTROLUMINESCENT UNIT

[75] Inventors: Teresa Langer; Barbara Krukowska-Fulde; Jerzy Langer, all of Warsaw, Poland

[73] Assignees: Osrodek Badawczo-Rozwojowy Monokrysztalow; Uniwersytet Warszawaki Instytut Fizyki Doswiadczalnej, both of Warsaw, Poland

[21] Appl. No.: 947,335

[22] Filed: Sep. 28, 1978

Related U.S. Application Data

[63] Continuation of Ser. No. 759,375, Jan. 14, 1977, abandoned, which is a continuation of Ser. No. 621,044, Oct. 9, 1975, abandoned.

[30] Foreign Application Priority Data

Oct. 10, 1974 [PL] Poland .................................. 174745

[51] Int. Cl.$^2$ .......................... H01J 1/63; C09K 11/10
[52] U.S. Cl. ..................................... 313/503; 252/512; 252/521; 252/301.4 H

[58] Field of Search ................ 252/512, 521, 301.4 H, 252/301.6 R, 62.3 E, 62.3 R; 313/503; 331/94.5 F; 357/6, 63, 64; 428/917, 539

[56] References Cited

U.S. PATENT DOCUMENTS

| | | | |
|---|---|---|---|
| 3,503,812 | 3/1970 | Prener et al. ........................... | 148/33 |
| 3,541,375 | 11/1970 | Aven ...................................... | 357/63 |

OTHER PUBLICATIONS

Appl. Phys. Lett. 34(3), Feb. 1, 1979, "Semiconducting CdF$_2$:Mn—A New Material for Efficient Blue-Green Electroluminescence".

Journal of Crystal Growth 1 (1967) 183–186, "Preparation and Some Properties of CdF$_2$ Single Crystals".

*Primary Examiner*—E. Suzanne Parr
*Attorney, Agent, or Firm*—Haseltine, Lake & Waters

[57] ABSTRACT

Electroluminescent device for emitting green light comprising a conducting cadmium fluoride crystal of electron concentration greater than $10^{15}$ cm$^{-3}$ having a manganese impurity of N$_{Mn}$ concentration in the range: 0.1 mole percent $<$N$_{Mn}<$5% mole percent, and an insulating or semi-insulating layer separating the metallic electrode from the crystal.

3 Claims, No Drawings

ELECTROLUMINESCENT UNIT

This is a continuation of application Ser. No. 759,375, filed Jan. 14, 1977, now abandoned, which in turn is a Rule 60 continuation of 621,044, filed Oct. 9, 1975, now abandoned.

FIELD OF THE INVENTION

The subject of the present invention is an electroluminescent unit which may find a wide range of applications in light emitting equipment, operating at a reduced power consumption rate.

PRIOR ART

A rapid increase in demand for miniaturized high-efficiency light sources has contributed to an intensive development of research in the field of semiconductor light sources. The electroluminescent equipment, manufactured presently, is primarily based on $A^{III}B^V$ and $V^{II}B^{VI}$ type compounds. The manufacture of these compounds is, however, restricted by the considerable shortage of raw materials (especially gallium) and by the use of very expensive manufacturing methods. For these reasons extensive research is in progress to work out a design of electroluminescent equipment based on other semiconductor materials.

Such a material which could be successfully applied to design electroluminescent units is cadmium fluoride. This is justified by the following properties of cadmium fluoride, viz.

1. Crystal transparency region (transmission of approx. 90 percent) extends from near ultraviolet (200 nm) to medium infrared (10,000 nm).
2. It is possible to obtain conducting crystals of n type ($\rho \approx$ approx. 1 Ohm.cm) by doping with trivalent metals.
3. Cadmium fluoride has a small reflection coefficient of R=approx. 6 percent.
4. It is possible to introduce dopants at high concentrations.
5. Cadmium fluoride crystals are obtained by a relatively simple technological process (melting point =approx. 1,050° centrigrade).
6. Low price of raw materials permits obtaining inexpensive light omitting devices of large area.

Numerous publications concerning the observation of electroluminescence in cadmium fluoride crystals are widely known, viz.: (1) J. Iambe, D. K. Donald, W. C. Wassol, T. Colo—Applied Phsica, Lott. 8, 16 (1966), (2) B. S. Skorobogatov, M. P. Dubovik, W. W. Azarov, L. B. Kolner—Optika 1 spoktroskopija 22, 981 (1967), (3), M. D. Dubovik, Ju. B. Potrenko, B. S. Skorobogatov "Spoktroskopija kristulov", Wyd. "Nauka" (USSR) (1970), p. 232, (4) P. P. Yanoy, N. A. Dafico—J. Appl. Phys. Lett. 44, 5029 (1973). In all cases admixtures of rare earths were luminous centers which supplied, simultaneously, the conductivity electrons. A useful output was obtained solely when using an electrolytic cell, the luminescence of which was obtained by contact of a semiconductor with electrolyte. Results were published by the Authors (1) J. Lambe, D. K. Donald, C. Wassol, T. Cole—Appl. Phys. Lett. 8, 16, (1966). The luminescence of electroluminescent diodes of the Schottky type described in other publications, referred to above, was characterized by low output which excluded practical application. From the research performed by the authors of the present publication on the photoluminescence of cadmium fluoride crystals doped with manganese, (5) J. M. Langer, T. Langer, G. L. Pearson, B. Krukowska-Fuldo-Phys. Stat. Sol.(A), 25, K61 (1974) it was discovered that very efficient luminescence centers causing green luminescence were the manganese impurities. Because of the high resistivity of cadmium fluoride doped with manganese done in order to achieve efficient electroluminescence, it was decided to utilize the conductivity of cadmium fluoride when doped with trivalent elements such as e.g. rare earths, scandium, yttrium, gallium or indium which introduce shallow donor levels in the host material.

The results of the research referred to above did not make possible designing efficient electroluminescent devices based on cadmium fluoride.

SUMMARY OF THE INVENTION

An object of the present invention is to provide a highly efficient electroluminescent unit based on cadmium fluoride, free from the disadvantages previously described, i.e. to produce a unit of high luminescent efficiency.

The substance of the present invention lies in doping cadmium fluoride with two kinds of impurities. One group of impurities consists of manganese ions, ensuring the existence of luminescent centers, and the other group consists of elements which represent shallow donors within the host material.

A cadmium fluoride crystal, doubly doped both with maganese and one of the trivalent elements meets two basic criteria of electroluminescent materials, i.e. good electronic conductivity and the presence of efficient radiative recombination centers.

Because the conductivity of cadmium fluoride crystals is of a monopolar nature (electronic), the electroluminescence may occur either by ionization or impact excitation. Therefore the application of metal - semiconductor contact, known in the art, which permits obtaining a strong electric field, necessary to accelerate electrons, does not ensure an adequate luminesence efficiency. In order to solve this problem, the cadmium fluoride crystals were separated from the blocking electrode by an insulating layer, (Metal-Insulator-Semiconductor structure). This layer prevents an extraction of electrons and enables their accumulation at positive bias of the blocking electrode. With such a construction the electroluminescent device operates by applying an alternating current.

The electroluminescent devices of the construction described above produce a strong, green luminescence at room temperature with quantum efficiency above $10^{-3}$ and the electroluminesecence spectrum concides with the photoluminescence spectrum and reaches a maximum at $\lambda_{maz.}=$approx. 520 $\mu$m.

It was found that useful operation parameters were obtained when using conducting cadmium floride crystals with a free electron concentration of more than $10^{15}$ cm$^{-3}$, doped with manganese of H$_{Mn}$ concentration in the range 0.1 mole percent $<$ H$_{Mn}$ $<$ 5 mole percent.

The luminescence area is restricted solely by manufacturing facilities and in components which were designed by the inventors reached 1 sq. cm.

Useful luminous brightness is obtained with a power supply less than 100 mN/cm$^2$.

What we claim is:
1. An electroluminescent device comprising a metal blocking electrode and an electroluminescent material comprising a semiconducting cadmium fluoride crystal doubly doped with manganese serving as luminescence activators and a trivalent element serving as shallow donors selected from the group consisting of rare earths, scandium, yttrium, gallium and indium, the electron concentration in the doubly doped crystal being greater than $10^{15}$ cm$^{-3}$, the concentration of manganese impurities ranging from 0.1 mole percent to 5 mole percent, and wherein the doubly doped cadmium fluoride crystal is separated from the metal blocking electrode by an insulating or semi-insulating layer, electroluminescence occurring under the action of a high electric field at the depletion polarization of a semiconductor.

2. An electroluminescent device as claimed in claim 1 wherein said insulating or semi-insulating layer is constituted to prevent extraction of electrons and accumulation at positive bias of the blocking electrode whereby the device is operative with a.c. current.

3. An electroluminescent device as claimed in claim 2 wherein said device produces strong, green luminescence at room temperature with quantum efficiency above $10^{-3}$ and wherein the electroluminescence spectrum coincides with the photoluminescence spectrum and reaches a maximum at about 520 nm.

* * * * *